(12) United States Patent
Gao et al.

(10) Patent No.: US 8,309,399 B2
(45) Date of Patent: Nov. 13, 2012

(54) POWER SEMICONDUCTOR MODULE AND METHOD OF MANUFACTURING THE SAME

(75) Inventors: Shan Gao, Gyunggi-do (KR); Seog Moon Choi, Seoul (KR); Tae Hyun Kim, Seoul (KR); Ju Pyo Hong, Gyunggi-do (KR); Bum Sik Jang, Gyunggi-do (KR); Ji Hyun Park, Seoul (KR)

(73) Assignee: Samsung Electro-Mechanics Co., Ltd, Suwon, Gyunggi-Do (KR)

( * ) Notice: Subject to any disclaimer, the term of this patent is extended or adjusted under 35 U.S.C. 154(b) by 0 days.

(21) Appl. No.: 13/246,615

(22) Filed: Sep. 27, 2011

(65) Prior Publication Data

US 2012/0015484 A1    Jan. 19, 2012

Related U.S. Application Data

(62) Division of application No. 12/551,238, filed on Aug. 31, 2009, now Pat. No. 8,058,722.

(30) Foreign Application Priority Data

Jul. 20, 2009  (KR) .................. 10-2009-0066060

(51) Int. Cl.
*H01L 21/50* (2006.01)

(52) U.S. Cl. ............................. 438/118; 257/E21.499
(58) Field of Classification Search ............ 438/118; 257/698, 714, E23.097, E23.011, E23.499
See application file for complete search history.

(56) References Cited

U.S. PATENT DOCUMENTS

| | | | | |
|---|---|---|---|---|
| 4,389,268 A * | 6/1983 | Oshima et al. | ............... | 156/150 |
| 6,097,089 A * | 8/2000 | Gaku et al. | .................. | 257/712 |
| 6,265,767 B1 * | 7/2001 | Gaku et al. | ................... | 257/678 |
| 8,058,722 B2 * | 11/2011 | Gao et al. | ...................... | 257/698 |

* cited by examiner

*Primary Examiner* — Roy Potter
(74) *Attorney, Agent, or Firm* — Blakely Sokoloff Taylor & Zafman LLP

(57) ABSTRACT

Disclosed herein is a power semiconductor module. The module includes metal plates each having a first through hole, with an anodic oxidation layer formed on a surface of metal plates and an interior of the first through hole. A cooling member has a second through hole at a position corresponding to the first through hole, and the metal plates are attached to both sides of the cooling member. A circuit layer is formed on the anodic oxidation layer and performs an interlayer connection through a via formed in the first and second through holes. A power device is connected to the circuit layer. A resin encapsulant encloses the circuit layer and the power device. A housing is installed to each of the metal plates to form a sealing space for the resin encapsulant.

10 Claims, 5 Drawing Sheets

POWER SEMICONDUCTOR MODULE AND METHOD OF MANUFACTURING THE SAME

CLAIM TO PRIORITY AND CROSS REFERENCE TO RELATED APPLICATION(S)

This application is a Divisional application of U.S. patent Ser. No. 12/551,238, filed on Aug. 31, 2009, entitled "Power Semiconductor Module And Method Of Manufacturing The Same", and claims the benefit of Korean Patent Application No. 10-2009-0066060, filed on Jul. 20, 2009, entitled "POWER SEMICONDUCTOR MODULE AND A METHOD OF MANUFACTURING THE SAME", which is hereby incorporated by reference in its entirety into this application.

BACKGROUND OF THE INVENTION

1. Technical Field

The present invention relates to a power semiconductor module and a method of manufacturing the power semiconductor module.

2. Description of the Related Art

The recent development of the power electronics industry is allowing the miniaturization and densification of electronic products to be achieved. Accordingly, a method of reducing the size of an electronic device itself, and also a method of installing as many devices and wires as possible in a given space has become important to the design of a semiconductor package. The density of semiconductor devices and wires of this package has been becoming greater and greater, and a large amount of heat is generated in the package. Since the heat affects the lifespan and operation of an electronic product, the dissipation of heat in the high density package is important.

FIG. 1 is a sectional view illustrating a conventional power module package. As shown in the drawing, semiconductor devices including a power device 15 and a control device 13 are soldered or bonded to the metallic surface of a direct copper bonding (DCB) circuit board 10. The circuit board 10 must have thermal conductivity in addition to electrically insulating the semiconductor devices from a base plate 20 of the module package. Here, the base plate 20 and the circuit board 10 are insulated by a ceramic material such as $Al_2O_3$, AlN, SiN, or SiC or organic material such as epoxy or polyimide.

The top surfaces of the semiconductor devices 13 and 15 are connected to the structured area of the metallic surface through thin aluminum connecting wires. Further, a passive device such as a gate resister or a current/temperature sensor may be integrated into the module, and a protective and drive circuit device and circuit may be also integrated in the module.

Such a conventional power module package is constructed so that a plurality of power devices 15 and diodes are attached to one DCB board 10 through soldering 17, are attached to the base plate 20 made of copper using solder 23 so as to provide good thermal properties and are covered by a housing. The devices 13 and 15 are electrically connected to the board 10 using wedge bonding, and the board 10 is electrically connected to a terminal 27 of the housing. The semiconductor devices 13 and 15 and wires are encapsulated by silicone gel, and a heat sink 25 is attached to the back of the base plate 20.

However, the conventional power module package constructed as described above has the following problems.

As the package is miniaturized, the number of semiconductor devices placed in the same amount of space becomes increased, so that a large amount of heat is generated in the package. The heat sink is provided on only the lower portion of the package, so that heat cannot be efficiently dissipated.

Further, as the DCB board 10 is used, an expensive and large copper plate 20 is required for the dissipation of heat. Moreover, the manufacturing process is complicated because the two bonding processes of bonding the semiconductor devices to the DCB board and bonding the DCB board to the base plate must be performed. Further, because of the bonding interface 17 between the semiconductor devices 13 and 15 and the DCB board 10 and the bonding interface between the DCB board 10 and the base plate 20, heat dissipating characteristics are deteriorated.

SUMMARY OF THE INVENTION

The present invention has been made in an effort to provide a power semiconductor module which improves heat dissipating performance and has a symmetric structure, so that the module has performance superior to a module of the same size.

In a power semiconductor module according to an embodiment of the present invention, metal plates each having a first through hole are provided, with an anodic oxidation layer formed on a surface of the metal plates and an interior of the first through hole. A cooling member has a second through hole at a position corresponding to the first through hole, and the metal plates are attached to both sides of the cooling member. A circuit layer is formed on the anodic oxidation layer and performs an interlayer connection through a via formed in the first and second through holes. A power device is connected to the circuit layer. A resin encapsulant encloses the circuit layer and the power device. A housing is installed to each of the metal plates to form a sealing space for the resin encapsulant.

Each of the metal plates may be made of aluminum or aluminum alloy, and the anodic oxidation layer may be an aluminum anodic oxidation layer ($Al_2O_3$).

The power semiconductor module may further include a thermal conductive adhesive layer between each side of the cooling member and the corresponding metal plate on which the anodic oxidation layer is formed.

The cooling member may comprise a heat pipe in which a refrigerant flows.

The metal plates may be attached to the cooling member in such a way as to be symmetric with respect to the cooling member.

In a power semiconductor module according to another embodiment of the present invention, a coupling assembly is made by attaching metal plates to both sides of a cooling member. An anodic oxidation layer is formed on a surface of the coupling assembly and an interior of a through hole which is formed to pass through the coupling assembly. A circuit layer is formed on the anodic oxidation layer and performs interlayer connection through a via which is formed in the through hole. A power device is connected to the circuit layer. A resin encapsulant encloses the circuit layer and the power device. A housing is installed to each of the metal plates to form a sealing space for the resin encapsulant.

Each of the metal plates may be made of aluminum or aluminum alloy, and the anodic oxidation layer may be an aluminum anodic oxidation layer ($Al_2O_3$).

The power semiconductor module may further include a thermal conductive adhesive layer between each side of the cooling member and the corresponding metal plate.

The cooling member may comprise a heat pipe in which a refrigerant flows.

The metal plates may be attached to the cooling member in such a way as to be symmetric with respect to the cooling member.

A method of manufacturing a power semiconductor module according to an embodiment of the present invention includes (A) forming a first through hole in each of metal plates and forming an anodic oxidation layer on an interior of the first through hole and surface of the metal plates, (B) attaching the metal plates, each having the anodic oxidation layer formed thereon, to both sides of a cooling member which has a second through hole at a position corresponding to the first through hole, (C) forming a circuit layer on a via formed in the first and second through holes and the anodic oxidation layer, (D) connecting a power device to the circuit layer and forming a housing on each of the metal plates to enclose the power device, and (E) injecting a resin encapsulant into a sealing space in the housing.

In (A) forming the first through hole in each of the metal plates, each of the metal plates may be made of aluminum or aluminum alloy, and the anodic oxidation layer may be an aluminum anodic oxidation layer ($Al_2O_3$).

In (B) attaching the metal plates to both sides of the cooling member, a thermal conductive adhesive layer may be formed between each side of the cooling member and the corresponding metal plate on which the anodic oxidation layer is formed.

In (B) attaching the metal plates to both sides of the cooling member, the cooling member may comprise a heat pipe in which a refrigerant flows.

In (B) attaching the metal plates to both sides of the cooling member, the metal plates may be attached to the cooling member in such a way as to be symmetric with respect to the cooling member.

A method of manufacturing a power semiconductor module according to another embodiment of the present invention includes (A) attaching metal plates to both sides of a cooling member and subsequently forming a through hole and forming an anodic oxidation layer on an interior of the through hole and surface of the cooling member attached the metal plates, (B) forming a circuit layer on a via formed in the through hole and the anodic oxidation layer, (C) connecting a power device to the circuit layer and forming a housing on each of the metal plates to enclose the power device, and (D) injecting a resin encapsulant into a sealing space in the housing.

In (A) attaching the metal plates to both sides of the cooling member, each of the metal plates may be made of aluminum or aluminum alloy, and the anodic oxidation layer may be an aluminum anodic oxidation layer ($Al_2O_3$).

In (A) attaching the metal plates to both sides of the cooling member, a thermal conductive adhesive layer may be formed between each side of the cooling member and the corresponding metal plate.

In (A) attaching the metal plates to both sides of the cooling member, the cooling member may comprise a heat pipe in which a refrigerant flows.

In (B) forming the circuit layer, the metal plates may be attached to the cooling member in such a way as to be symmetric with respect to the cooling member.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

DESCRIPTION OF THE PREFERRED EMBODIMENTS

Figure 1:
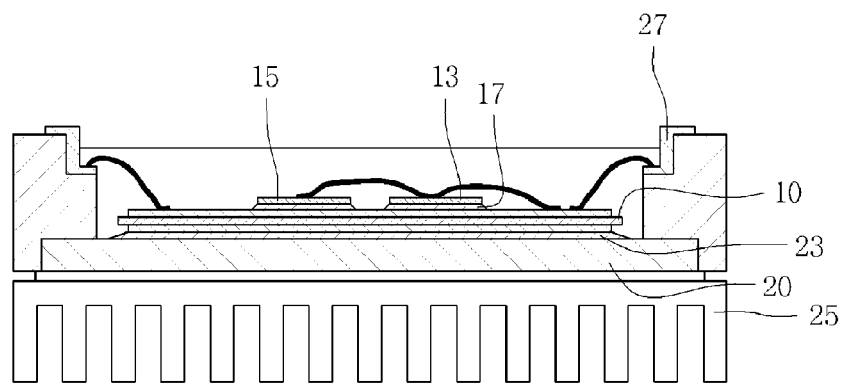
FIG. 1 is a sectional view illustrating a conventional power module package.

Various objects, advantages and features of the invention will become apparent from the following description of embodiments with reference to the accompanying drawings. Throughout the accompanying drawings, the same reference numerals are used to designate the same or similar components. For the clarity of description, known functions and constructions relating to the present invention will be omitted herein.

Hereinafter, the preferred embodiments of the present invention will be described in detail with reference to the accompanying drawings.

Figure 6:
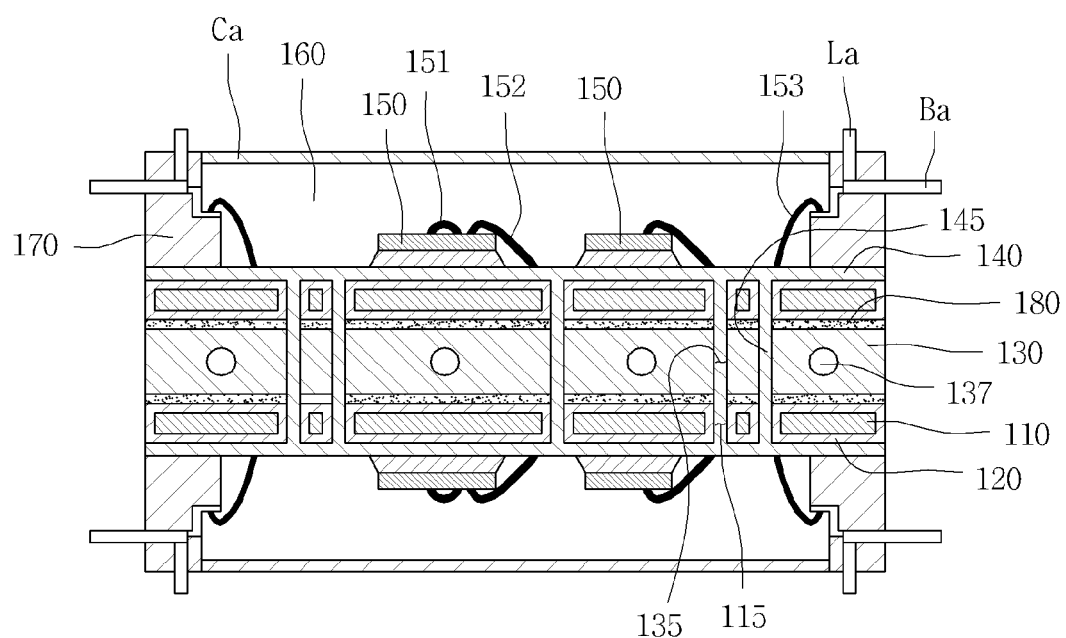

FIG. 6 is a sectional view illustrating a power semiconductor module, according to a first embodiment of the present invention. The power semiconductor module according to this embodiment will be described below with reference to the drawing.

As shown in FIG. 6, the power semiconductor module according to this embodiment includes metal plates 110 having anodic oxidation layers 120, a cooling member 130, circuit layers 140, power devices 150, resin encapsulants 160 and housings 170. Since the module of the present invention has a symmetric structure, the metal plates 110, the circuit layers 140, the power devices 150, the resin encapsulants 160 and the housings 170 are placed above and below the cooling member 130.

Here, the metal plates 110 having the anodic oxidation layers 120 and the circuit layers 140 perform both the functions of the base plate 20 and the DCB circuit board 10 which are shown in FIG. 1.

Each metal plate 110 may be made of aluminum Al or aluminum alloy having very superior heat transfer characteristics as well as a metal material which is relatively cheap and easily obtainable. An anodized metal substrate (AMS) may be used as the metal plate 110 on which the anodic oxidation layer 120 is formed.

Further, the metal plate 110 has first through holes 115. Each first through hole 115 is used to form a via 145 for an interlayer connection which will be described later.

Meanwhile, the anodic oxidation layer 120 is formed on the surface of the metal plate 110 and the interior of the first through hole 115, and perform an insulating function for preventing electricity from being transferred between the circuit layer 140 including the via 145 and the metal plate 110. The anodic oxidation layer 120 permits the formation of the circuit layer 140 thereon. The anodic oxidation layer 120 is thinner than an insulation layer used in the DCB circuit board of FIG. 1, thus rapidly transmitting heat from the power device 150 to the metal plate 110, therefore increasing heat dissipating efficiency. The anodic oxidation layer 120 may use an aluminum oxide film ($Al_2O_3$) having relatively high heat transfer characteristics of about 10 to 30 W/mK. In detail, the anodic oxidation layer 120 is formed by immersing the metal plate 110 with the first through hole 115 into an electrolyte such as boric acid, phosphoric acid, sulfuric acid, or chromic acid, applying the anode to the metal plate 110, and applying the cathode to the electrolyte.

The metal plates 110 are attached to both sides of the cooling member 130, so that the power semiconductor module has a stable structure and realizes performance superior to a module of the same size. Here, the metal plates 110 are attached to the cooling member 130 in such a way as to be symmetric with respect to the cooling member 130, so that the power semiconductor module can have a more stable structure. Further, in order to enhance adhesive force and the efficiency of heat conduction when the metal plates 110 are attached to both sides of the cooling member 130, thermal conductive adhesive layers 180 are preferably formed between both sides of the cooling member 130 and the metal plates 110 having the anodic oxidation layers 120.

Further, the cooling member 130 has second through holes 135. Each second through hole 135 is formed at a position corresponding to the first through hole 115 when the metal plates 110 are attached to both sides of the cooling member 130. Similarly to the first through hole 115, the second through hole 135 is used to form a via 145 for an interlayer connection which will be described later.

Preferably, the cooling member 130 comprises a heat pipe 137 which has a refrigerant injection hole therein and injects a refrigerant into the hole to perform an additional heat dissipation function. The refrigerant is evaporated and condensed, thus dissipating heat transferred from the power device 150 and the circuit layer 140.

Generally, in the power semiconductor module with a high power semiconductor chip which generates a large amount of heat as a result of its operation, it is very important to dissipate the generated heat in order to ensure the reliability of the module. According to this embodiment, the module includes the cooling member 130 as well as the metal plates 110 having the anodic oxidation layers 120, thus achieving more improved heat dissipating performance.

The circuit layer 140 is formed on the anodic oxidation layer 120 of each metal plate 110. Since the module of the present invention has a symmetric structure with respect to the cooling member 130, the circuit layers 140 are placed, respectively, above and below the cooling member 130. Thus, in order to electrically connect the upper circuit layer 140 to the lower circuit layer 140, the via 145 is formed in the first and second through holes 115 and 135. Preferably, the via 145 is formed along with the circuit layer 140 through electroplating and electroless plating.

Further, each circuit layer 140 is connected to the power device 150 using a second wire 152, and is connected to a bus-bar Ba, installed in the housing 170 and connected to a lead frame La protruding out of the housing 170, using a third wire 153, thus communicating with the exterior of the housing 170.

The power device 150 is a high power semiconductor chip such as an insulated-gate bipolar transistor (IGBT), a diode or a control device, and is attached to the circuit layer 140 by solder. Here, an internal circuit of the power device 150 is connected by a first wire 151, and the power device 150 and the circuit layer 140 are connected to each other by the second wire 152.

Each housing 170 is installed to the metal plate 110 to form a sealing space for the resin encapsulant 160. The resin encapsulant 160 is injected into the sealing space, thus protecting the circuit layer 140, the power device 150, and the first to third wires 151, 152 and 153 from external vibration or contamination.

The lead frame La is provided on the housing 170 in such a way as to protrude out and be connected to the circuit layer 140 to provide the power device 150 with a drive signal, and the bus-bar Ba connected to the lead frame La is installed in the housing 170.

Meanwhile, a cover member Ca may be provided on the housing 170 to protect the resin encapsulant 160 from the exterior.

FIGS. 2 to 6 are views sequentially illustrating a method of manufacturing the power semiconductor module according to the first embodiment of the present invention. Hereinafter, the manufacturing process of the power semiconductor module according to the first embodiment will be described with reference to the drawings.

Figure 2:
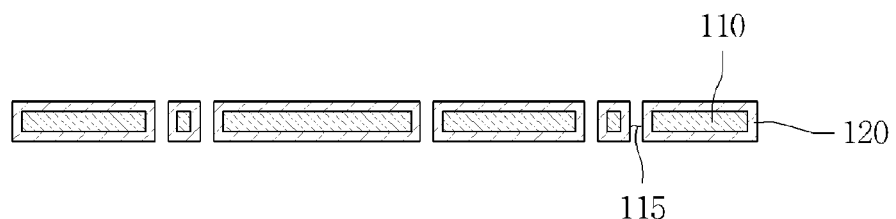
FIGS. 2 to 6 are sectional views illustrating a method of manufacturing a power semiconductor module, according to a first embodiment of the present invention.

First, as shown in FIG. 2, the first through hole 115 is formed in the metal plate 110, and the anodic oxidation layer 120 is formed on the interior of the first through hole 115 and the surface of the metal plate 110. Preferably, the first through hole 115 is formed through mechanical machining or laser machining. Further, the anodic oxidation layer 120 is formed by immersing the metal plate 110 with the first through hole 115 into an electrolyte such as boric acid, phosphoric acid, sulfuric acid, or chromic acid, applying the anode to the metal plate 110, and applying the cathode to the electrolyte. Further, the metal plate 110 is made of aluminum or aluminum alloy, and the anodic oxidation layer 120 comprises an aluminum anodic oxidation layer ($Al_2O_3$).

Figure 3:
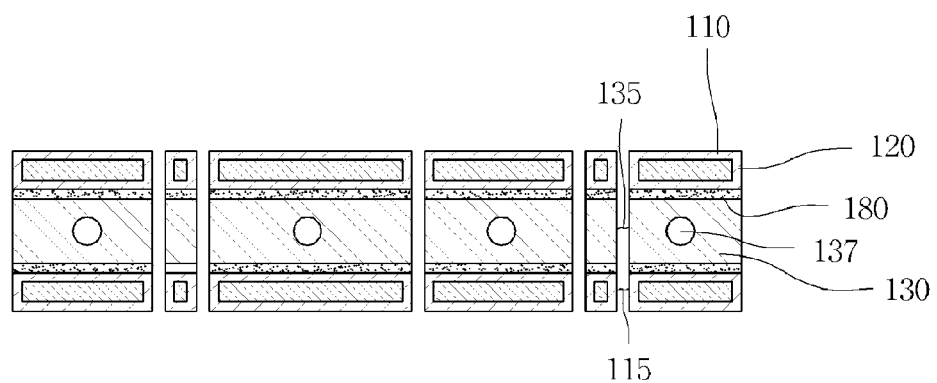

Subsequently, as shown in FIG. 3, the metal plate 110 having the anodic oxidation layer 120 is attached to each side of the cooling member 130 having the second through hole 135 at a position corresponding to the first through hole 115. Through mechanical or laser machining, the second through hole 135 is formed in the cooling member 130. Here, since the via 145 must be formed in the second through hole 135 at a step that will be described below, the second through hole 135 must be formed at a position corresponding to the first through hole 115. After the second through hole 135 is formed, the metal plates 110 must be attached to both sides of the cooling member 130. In order to enhance adhesive force and the efficiency of heat conduction, preferably, the thermal conductive adhesive layers 180 are formed on both sides of the cooling member 130 and then the metal plates 110 having the anodic oxidation layers 120 are bonded to the cooling member 130. When the metal plates 110 are bonded to the cooling member 130, the metal plates 110 are arranged to be symmetric with respect to the cooling member 130, thus providing a stable structure to the power semiconductor module.

Meanwhile, the heat pipe 137 in which the refrigerant flows is used as the cooling member 130, thus enhancing heat dissipating efficiency.

Figure 4:
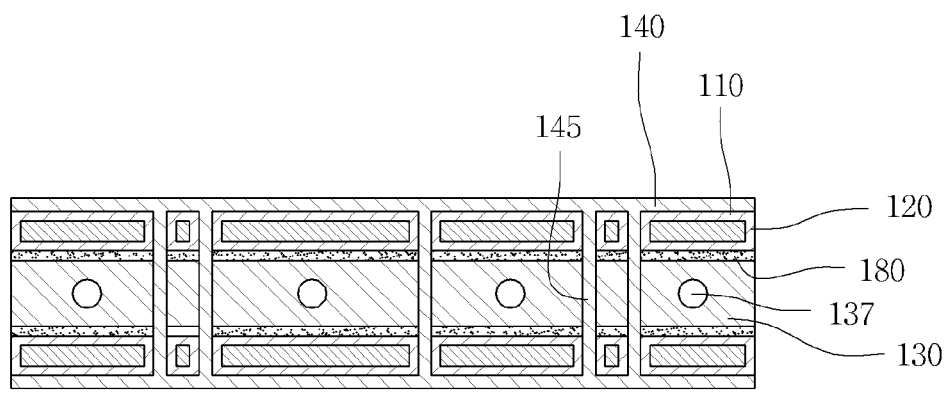

Thereafter, as shown in FIG. 4, the circuit layer 140 is formed on the anodic oxidation layer 120 and the via 145 formed in the first and second through holes 115 and 135. The anodic oxidation layer 120 and the interior of the first and second through holes 115 and 135 comprise an insulation layer. Thus, preferably, after a seed layer is formed through electroless plating, electroplating is performed, so that the circuit layer 140 having the via 145 is formed.

Figure 5:
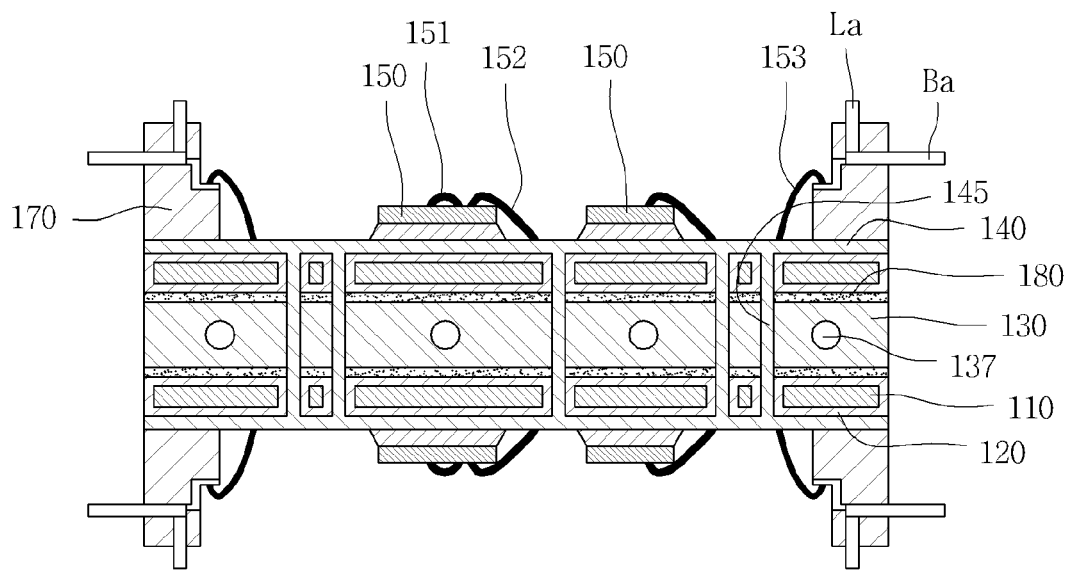

Next, as shown in FIG. 5, the power device 150 is connected to the circuit layer 140 and the housing 170 is formed on the metal plate 110 to enclose the power device 150. Preferably, the power device 150 is attached to the circuit layer 140 using the solder, the internal circuit of the power device 150 is connected by the first wire 151, and the power device 150 and the circuit layer 140 are connected to each other by the second wire 152. Further, the circuit layer 140 is connected to the bus-bar Ba, installed in the housing 170 and connected to the lead frame La protruding out of the housing 170, using the third wire 153, thus communicating with the exterior of the housing 170. When the connection of the power device 150 with the circuit layer 140 has been completed, the housing 170 is provided to create the sealing space for the resin encapsulant 160 which will be injected in a subsequent step.

Thereafter, as shown in FIG. 6, the resin encapsulant 160 is injected into the sealing space of the housing 170. The injection of the resin encapsulant 160 protects the circuit layer 140, the power device 150, the first to third wires 151, 152 and 153 in the housing 170 from external vibration or contamination.

Figure 10:
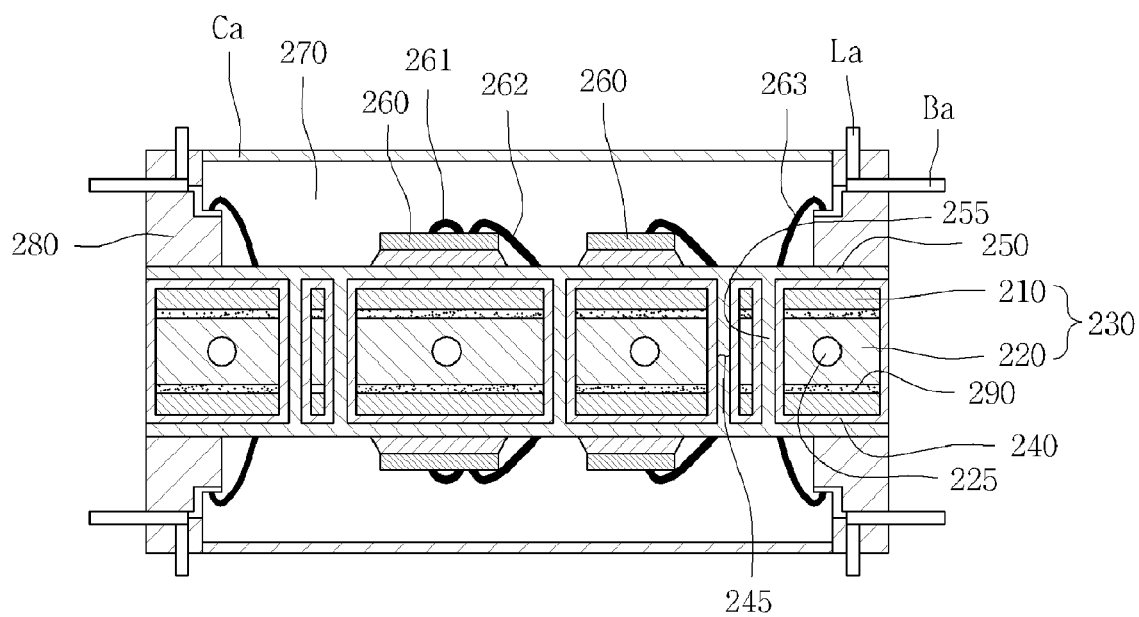

FIG. 10 is a sectional view illustrating a power semiconductor module, according to a second embodiment of the present invention. Those elements common to both the first and second embodiments will carry the same reference numerals, and duplicate description will be omitted herein.

As shown in FIG. 10, the power semiconductor module according to this embodiment includes a coupling assembly 230, circuit layers 250, power devices 260, resin encapsulants 270 and housings 280.

The coupling assembly 230 is made by attaching metal plates 210 to both sides of a cooling member 220. In order to enhance adhesive force and the efficiency of heat conduction between the cooling member 220 and the metal plates 210, preferably, thermal conductive adhesive layers 290 are formed on both sides of the cooling member 220 and then the metal plates 210 are attached to the cooling member 220.

The module according to this embodiment has a through hole 245 which passes one time through the coupling assembly 230, made by attaching the metal plates 210 to the cooling member 220. Thus, unlike the first embodiment, the through hole 245 of the metal plate 210 is not distinguished from the through hole 245 of the cooling member 220.

When the power semiconductor module according to the second embodiment is compared with the power semiconductor module according to the first embodiment which is shown in FIG. 6, the most important difference is the position at which an anodic oxidation layer 240 is formed. The anodic oxidation layer 240 is formed on the interior of the through hole 245 and the surface of the coupling assembly 230. Thus, the anodic oxidation layer 240 is also formed on the surface of the cooling member 220, thus preventing electricity from being transferred between the circuit layers 250 and the cooling member 220 as well as between the circuit layers 250 and the metal plates 210.

Further, after the metal plates 210 are attached to the cooling member 220, the anodic oxidation layer 240 is formed. Therefore, the anodic oxidation layer 240 is not formed on an adhesive surface between each metal plate 210 and the cooling member 220. This allows heat of each metal plate 210 to be more easily transmitted to the cooling member 220, thus increasing heat dissipating efficiency. Preferably, the cooling member 220 comprises a heat pipe 225 which has a refrigerant injection hole therein and injects a refrigerant into the hole to perform an additional heat dissipation function.

Meanwhile, the circuit layers 250 are formed on the anodic oxidation layer 240 and connected through a via 255 formed in the through hole 245. Here, since the through hole 245 is formed to simultaneously pass through the metal plates 210 and the cooling member 220, there is not much possibility of forming a step in the through hole 245. Thus, the quality and efficiency of electroless plating/electroplating process which is performed to form the via 255 in the through hole 245 are improved.

Further, as in the first embodiment, the power semiconductor module according to the second embodiment includes the power device 260 connected to the circuit layer 250, the resin encapsulant 270 enclosing the circuit layer 250 and the power device 260, and the housing 280 installed to the metal plate 210 to form a sealing space for the resin encapsulant 270. Further, first to third wires 261, 262, and 263 perform the same functions they had in the first embodiment.

FIGS. 7 to 10 are views sequentially illustrating a method of manufacturing the power semiconductor module according to the second embodiment of the present invention. Hereinafter, the manufacturing process of the power semiconductor module according to the second embodiment will be described with reference to the drawings.

Figure 7:
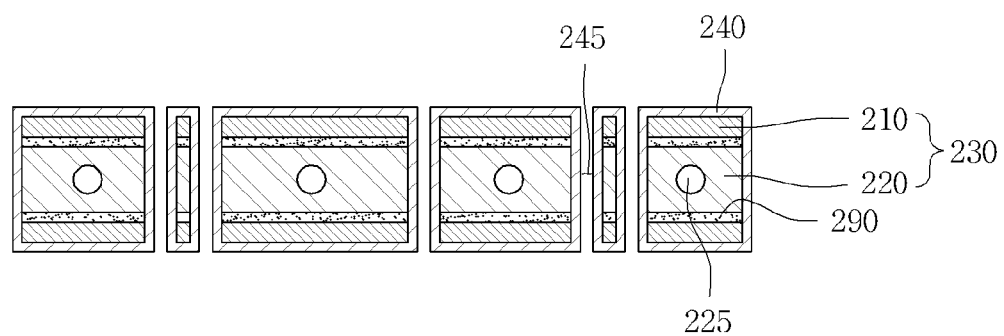
FIGS. 7 to 10 are sectional views illustrating a method of manufacturing a power semiconductor module, according to a second embodiment of the present invention.

First, as shown in FIG. 7, after the metal plates 210 are attached to both sides of the cooling member 220, the through hole 245 is formed. The anodic oxidation layer 240 is formed on the surface of the cooling member attached the metal plates as well as the interior of the through hole 245. Since the metal plates 210 are attached to the cooling member 220 and thereafter the anodic oxidation layer 240 is formed on the surfaces of the metal plates 210, the anodic oxidation layer 240 is formed on the surface of the cooling member 220 and the anodic oxidation layer 240 is not formed on the adhesive surface between each metal plate 210 and the cooling member 220, as described above. Further, according to this embodiment, the through hole 245 can be formed to simultaneously pass through both the cooling member 220 and the metal plates 210, thus aiding in the simplification of the process.

Figure 8:
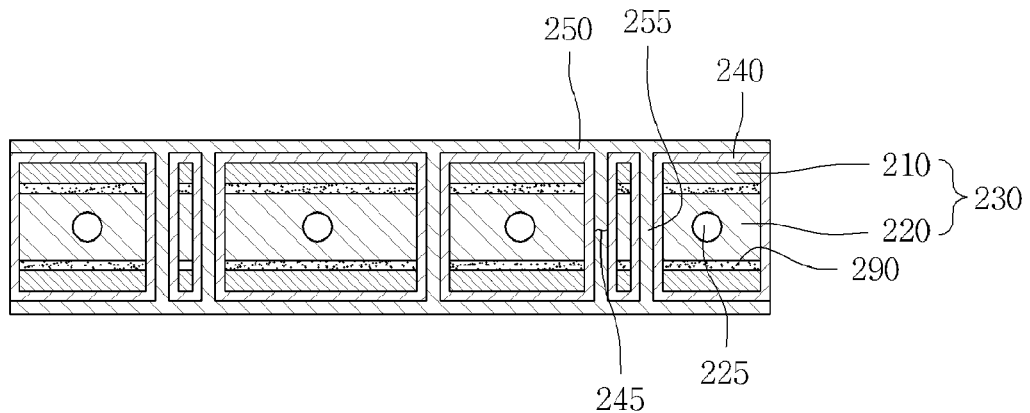

Next, as shown in FIG. 8, the circuit layer 250 including the via 255 formed in the through hole 245 is formed on the anodic oxidation layer 240. At the former step, the through hole 245 is formed with the metal plates 210 attached to both sides of the cooling member 220. Thus, there is no step in the through hole 245, so that it is possible to form the via 255 ensuring high coupling reliability between the circuit layers 250.

Figure 9:
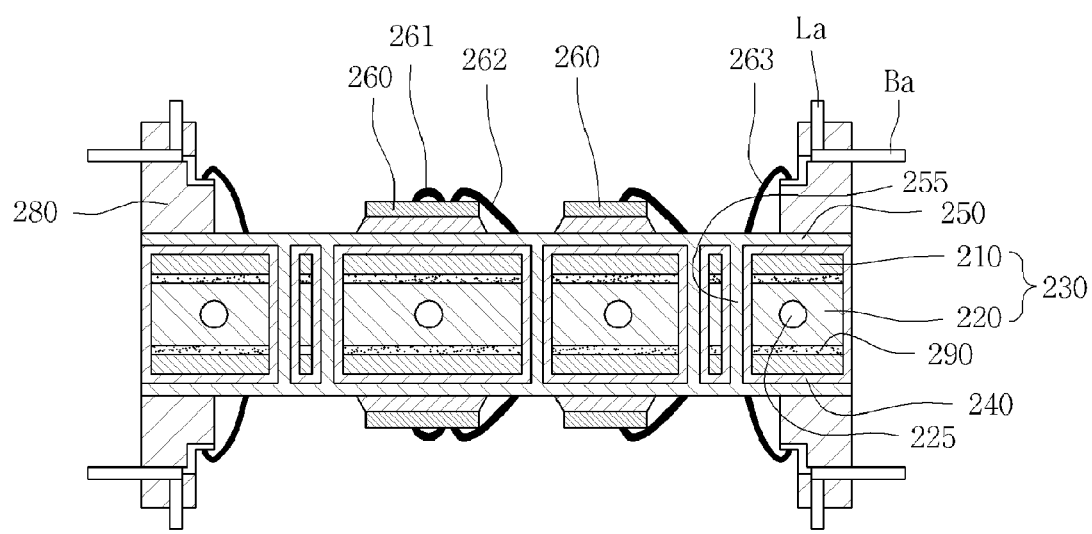

Thereafter, as shown in FIG. 9, each power device 260 is connected to the circuit layer 250 and each housing 280 is provided on the metal plate 210 to enclose the power device 260.

Subsequently, as shown in FIG. 10, the resin encapsulant 270 is injected into the sealing space in the housing 280.

As described above, the present invention provides a power semiconductor module, which has a smaller number of interfaces in comparison with a conventional DBC board, and includes an anodized metal substrate having a thin anodic oxidation layer, thus having better heat dissipating performance in comparison with the conventional DBC board. Moreover, the power semiconductor module is provided with a cooling member, thus further improving heat dissipating performance.

According to the present invention, an additional copper plate is not required, and an anodized metal substrate which is cheaper than a conventional DBC board is adopted, thus reducing manufacturing cost.

The present invention provides a power semiconductor module, which does not require a copper plate owing to an anodized metal substrate, thus realizing a simple structure, and which achieves the thinness of the power semiconductor module owing to a thin anodic oxidation layer.

Further, according to the present invention, a power semiconductor module is manufactured to have a symmetric structure with respect to a heat dissipating member, thus having performance superior to a module of the same size, and minimizing bending resulting from stress owing to the symmetric structure. Moreover, a via passing through metal plates secures the reliability of connecting upper and lower parts of the power semiconductor module.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A method of manufacturing a power semiconductor module, comprising:
    (A) forming a first through hole in each of metal plates, and forming an anodic oxidation layer on an interior of the first through hole and surface of the metal plates;
    (B) attaching the metal plates, each having the anodic oxidation layer formed thereon, to both sides of a cooling member which has a second through hole at a position corresponding to the first through hole;
    (C) forming a circuit layer on a via formed in the first and second through holes and the anodic oxidation layer;
    (D) connecting a power device to the circuit layer, and forming a housing on each of the metal plates to enclose the power device; and
    (E) injecting a resin encapsulant into a sealing space in the housing.

2. The method as set forth in claim 1, wherein, in (A) forming the first through hole in each of the metal plates, each of the metal plates is made of aluminum or aluminum alloy, and the anodic oxidation layer is an aluminum anodic oxidation layer ($Al_2O_3$).

3. The method as set forth in claim 1, wherein, in (B) attaching the metal plates to both sides of the cooling member, a thermal conductive adhesive layer is formed between each side of the cooling member and the corresponding metal plate on which the anodic oxidation layer is formed.

4. The method as set forth in claim 1, wherein, in (B) attaching the metal plates to both sides of the cooling member, the cooling member comprises a heat pipe in which a refrigerant flows.

5. The method as set forth in claim 1, wherein, in (B) attaching the metal plates to both sides of the cooling member, the metal plates are attached to the cooling member in such a way as to be symmetric with respect to the cooling member.

6. A method of manufacturing a power semiconductor module, comprising:
    (A) attaching metal plates to both sides of a cooling member and subsequently forming a through hole, and forming an anodic oxidation layer on an interior of the through hole and surface of the cooling member attached the metal plates;
    (B) forming a circuit layer on a via formed in the through hole and the anodic oxidation layer;
    (C) connecting a power device to the circuit layer, and forming a housing on each of the metal plates to enclose the power device; and
    (D) injecting a resin encapsulant into a sealing space in the housing.

7. The method as set forth in claim 6, wherein, in (A) attaching the metal plates to both sides of the cooling member, each of the metal plates is made of aluminum or aluminum alloy, and the anodic oxidation layer is an aluminum anodic oxidation layer ($Al_2O_3$).

8. The method as set forth in claim 6, wherein, in (A) attaching the metal plates to both sides of the cooling member, a thermal conductive adhesive layer is formed between each side of the cooling member and the corresponding metal plate.

9. The method as set forth in claim 6, wherein, in (A) attaching the metal plates to both sides of the cooling member, the cooling member comprises a heat pipe in which a refrigerant flows.

10. The method as set forth in claim 6, wherein, in (B) forming the circuit layer, the metal plates are attached to the cooling member in such a way as to be symmetric with respect to the cooling member.

* * * * *